United States Patent
Fulton et al.

(10) Patent No.: US 8,671,717 B2
(45) Date of Patent: Mar. 18, 2014

(54) PHOTOVOLTAIC DEVICE HAVING LOW IRON HIGH TRANSMISSION GLASS WITH LITHIUM OXIDE FOR REDUCING SEED FREE TIME AND CORRESPONDING METHOD

(75) Inventors: Kevin R. Fulton, Howell, MI (US); Richard Hulme, Rochester Hills, MI (US); Scott V. Thomsen, South Lyon, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 1565 days.

(21) Appl. No.: 12/073,562

(22) Filed: Mar. 6, 2008

(65) Prior Publication Data

US 2009/0223252 A1    Sep. 10, 2009

(51) Int. Cl.
    C03C 4/00    (2006.01)
    C03B 1/00    (2006.01)
(52) U.S. Cl.
    CPC ............... *C03B 1/00* (2013.01); *C03C 4/0092* (2013.01)
    USPC .............................................................. 65/90
(58) Field of Classification Search
    USPC .............................................................. 65/93
    See application file for complete search history.

(56) References Cited

U.S. PATENT DOCUMENTS

| 3,615,767 | A * | 10/1971 | Conroy et al. ................... 501/27 |
| 6,391,810 | B1 | 5/2002 | Lenhart |
| 2003/0199384 | A1 | 10/2003 | Landa et al. |
| 2006/0169316 | A1 | 8/2006 | Thomsen et al. |
| 2006/0249199 | A1 | 11/2006 | Thomsen et al. |
| 2006/0293163 | A1 | 12/2006 | Landa et al. |
| 2007/0021289 | A1 | 1/2007 | Landa et al. |
| 2007/0036987 | A1 | 2/2007 | Landa et al. |
| 2007/0207912 | A1 | 9/2007 | Hulme et al. |
| 2007/0209698 | A1 | 9/2007 | Thomsen et al. |
| 2007/0215205 | A1 | 9/2007 | Thomsen et al. |

FOREIGN PATENT DOCUMENTS

| JP | 61-270234 | 11/1986 |
| JP | 1-239037 | 9/1989 |
| JP | 2003-171141 | 6/2003 |
| JP | 2007-238398 | 9/2007 |
| WO | WO 95/13993 | 5/1995 |
| WO | WO 2008/096876 | 8/2008 |

\* cited by examiner

*Primary Examiner* — Matthew Daniels
*Assistant Examiner* — Cynthia Szewczyk
(74) *Attorney, Agent, or Firm* — Nixon & Vanderhye P.C.

(57) ABSTRACT

A high transmission and low iron glass is provided for use in a photovoltaic device such as a solar cell. The glass substrate may be patterned on at least one surface thereof. In certain example embodiments, a combination of lithium oxide, antimony oxide, and salt cake is used in the glass to improve the refining conditions by lowering the melting temperature of the batch, thereby resulting in a quicker seed free time in the manufacturing process.

1 Claim, 3 Drawing Sheets

| Batch Move Phase | CA<br>Solar Base | Ex.1<br>0.5 Li2O Same Log 2 | Ex. 2<br>0.5% Li2O/LC, AL |
|---|---|---|---|
| Unit | kg | kg | kg |
| SAND | 49.4649 | 50.1702 | 47.8757 |
| SODA ASH | 16.1339 | 14.2071 | 15.0854 |
| DOLOMITE | 12.7592 | 12.8473 | 12.4206 |
| LIMESTONE | 5.3163 | 5.2515 | 5.3296 |
| SLAG | | | |
| SALT CAKE | 0.6934 | 0.7033 | 0.6775 |
| SODIUM ANTIMONATE | 0.2866 | 0.2251 | 0.2168 |
| SODIUIM NITRATE | 0.4623 | 0.4689 | 0.4517 |
| HYDRATED ALUMINA | 0.4161 | 0.4220 | 2.4164 |
| BORAX | | | |
| LITHUM CARBONATE | | 1.1956 | 1.1743 |
| SPODUMENE | | | |
| BATCH TOTAL | 85.5327 | 85.4910 | 85.6479 |

| Batch Move Phase | CA Solar Base | Ex.1 0.5 Li2O Same Log 2 | Ex. 2 0.5% Li2O/LC, AL |
|---|---|---|---|
| XRF Chemical Analysis | | | |
| SiO2BD (%) | 71.89 | 72.30 | 69.90 |
| Al2O3 (%) | 0.563 | 0.547 | 2.390 |
| Fe2O3 (%) | 0.020 | 0.021 | 0.022 |
| CaO (%) | 9.54 | 10 | 9.97 |
| MgO (%) | 3.81 | 4.12 | 4.02 |
| Na2O (%) | 13.76 | 12.38 | 13.07 |
| K2O (%) | 0.030 | 0.030 | 0.030 |
| TiO2 (%) | 0.0140 | 0.032 | 0.035 |
| MnO (%) | 0.0036 | 0.0037 | 0.0036 |
| SO3 (%) | 0.365 | 0.344 | 0.346 |
| Cr2O3 (%) | 0.0009 | 0.0011 | 0.0009 |
| BaO (%) | 0.0089 | 0.0088 | 0.0084 |
| Sb2O3 (%) | 0.265 | 0.216 | 0.207 |
| | | | |
| BRN | 32 | 33 | 34 |
| Optical Analysis | | | |
| Actual Thick: | 7.0 | 5.0 | 3.7 |
| Corrected to: | 3.2 | 3.2 | 3.2 |
| % Lt (D65) | 92.05 | 91.72 | 91.57 |
| % tuv (ISO 9050)AM 1.5 | 85.28 | 84.30 | 83.49 |
| % te (ISO 9050) AM 1.5 | 91.66 | 91.33 | 91.15 |
| wt % FeO Spec.Est. | 0.0003 | 0.0008 | 0.0006 |
| Ill. D65 10o Obs. | | | |
| L* | 96.83 | 96.70 | 96.63 |
| a* | -0.07 | -0.07 | -0.09 |
| b* | 0.35 | 0.35 | 0.37 |
| Seed Free Time (min) | 145 | 57 | 85 |

Fig. 3

PHOTOVOLTAIC DEVICE HAVING LOW IRON HIGH TRANSMISSION GLASS WITH LITHIUM OXIDE FOR REDUCING SEED FREE TIME AND CORRESPONDING METHOD

This invention relates to a high transmission low iron glass, including lithium oxide, for use in photovoltaic devices (e.g., solar cells) or the like. A method is also provided. In certain example embodiments, the glass composition used for the glass is a low-iron type glass composition which includes lithium oxide introduced to improve refining conditions by reducing seed free times. In certain example embodiments, the glass and glass batch may include antimony oxide in order to support oxidation of the FeO to $Fe_2O_3$. The glass substrate used in a photovoltaic device may be patterned in certain example embodiments of this invention.

BACKGROUND AND SUMMARY OF EXAMPLE EMBODIMENTS OF THE INVENTION

Photovoltaic devices (e.g., solar cells) are known in the art. A solar cell may include, for example, a photoelectric transfer film made up of one or more layers located between a pair of substrate. These layers may be supported by a glass substrate. Example solar cells are disclosed in U.S. Pat. Nos. 4,510,344, 4,806,436, 6,506,622, and 5,977,477, the disclosures of which are hereby incorporated herein by reference.

Substrate(s) in a solar cell are sometimes made of glass. Glass that is fairly clear in color and highly transmissive to visible light is sometimes desirable. Glass raw materials (e.g., silica sand, soda ash, dolomite, and/or limestone) typically include certain impurities such as iron, which is a colorant. The total amount of iron present is expressed herein in terms of $Fe_2O_3$ in accordance with standard practice. However, typically, not all iron is in the from of $Fe_2O_3$. Instead, iron is usually present in both the ferrous state ($Fe^{2+}$; expressed herein as FeO, even though all ferrous state iron in the glass may not be in the form of FeO) and the ferric state ($Fe^{3+}$). Iron in the ferrous state ($Fe^{2+}$; FeO) is a blue-green colorant, while iron in the ferric state ($Fe^{3+}$) is a yellow-green colorant. The blue-green colorant of ferrous iron ($Fe^{2+}$; FeO) is of particular concern when seeking to achieve a fairly clear or neutral colored glass, since as a strong colorant it introduces significant color into the glass. While iron in the ferric state ($Fe^{3+}$) is also a colorant, it is of less concern when seeking to achieve a glass fairly clear in color since iron in the ferric state tends to be weaker as a colorant than its ferrous state counterpart.

It has been found that the use of a low-iron highly transparent (optionally patterned) glass is advantageous for solar cell applications. The use of the low-iron composition in combination with the patterned surface(s) of the glass substrate(s) has been found to be advantageous with respect to optical properties, thereby leading to increased solar efficiency of a solar cell.

A limiting performance factor for glass in connection with photovoltaic devices is the seed level, as opposed to solar performance, in certain instances. High seed levels are undesirable, in that these represent small imperfections in the glass. Thus, it would be desirable to provide a glass composition, and method of making glass, in which seed level can be reduced (or seed level refining time can be reduced), for use in photovoltaic devices or the like.

In certain example embodiments of this invention, a solar cell glass substrate has a visible transmission of at least 75% (more preferably at least 80%, even more preferably at least 85%, and most preferably at least about 90%). In making such a glass, a batch therefor includes a base glass (e.g., soda lime silica glass) and in addition comprises (or consists essentially of in certain other embodiments) a very small amount of total iron.

It has been found that the use of lithium oxide in connection with high transmission low iron glass has the effect of improve refining conditions by lower the melting temperature of the glass (log $\eta=2$). In particular, it has been found that providing appropriate amounts of lithium oxide in low-iron high transmission glass lowers the log $\eta=2$ temperature so as to improve the refining of these oxidized glasses. Thus, the refining time required to achieve a seed free glass (or substantially seed free glass) can be reduced, which is high advantageous with respect to the glass manufacturing process. In certain example embodiments, the glass and glass batch may include antimony oxide in order to support oxidation of the FeO to $Fe_2O_3$.

In certain example embodiments of this invention, the low iron glass is particularly efficiently made with respect to both performance and manufacturability using a combination of certain amounts of salt cake, antimony oxide (e.g., antimony trioxide), optionally sodium nitrate, and lithium oxide.

In certain example embodiments, the resulting patterned glass substrate may have fairly clear color that may be slightly yellowish (a positive b* value is indicative of yellowish color). For example, in certain example embodiments, the patterned glass substrate may be characterized by a visible transmission of at least 90%, a total solar/energy value of at least 90%, a transmissive a* color value of from −1.0 to +1.0 (more preferably from −0.5 to +0.5, and most preferably from −0.2 to 0), and a transmissive b* color value of from 0 to +1.5 (more preferably from +0.1 to +1.0, and most preferably from +0.2 to +0.7). These properties may be realized at an example non-limiting reference glass thickness of from about 3-4 mm.

In certain example embodiments of this invention, there is provided a method of making patterned glass, the method comprising: providing a molten glass batch in a furnace or melter comprising $SiO_2$, from about 0.01 to 0.06% total iron, salt cake, lithium oxide, and antimony oxide, and refining the glass batch wherein the batch has a seed free time of less than 100 minutes; forwarding a glass ribbon from the furnace or melter to a nip between first and second rollers, at least one of the rollers having patter defined in a surface thereof, wherein the glass ribbon reaches the nip at a temperature of from about 1,900 to 2,400 degrees F.; at the nip, transferring the pattern from the roller(s) to the glass ribbon; the glass ribbon being at a temperature of from about 1,100 to 1,600 degrees F. upon exiting the nip; and annealing the glass ribbon at least after the ribbon exits the nip, thereby providing a patterned glass having a visible transmission of at least 90%, from about 0.01 to 0.06% total iron, from about 0.25 to 3.5% lithium oxide, from about 0.3 to 0.4% salt cake, and from about 0.01 to 1.0% antimony oxide.

In certain other example embodiments, there is provided a method of making a soda-lime-silica based low-iron highly transmissive glass for use in a photovoltaic device, wherein the glass has visible transmission of at least 90%, a transmissive a* color value of −1.0 to +1.0 and a transmissive b* color value of from 0 to +1.5; and wherein the method comprises providing the lithium oxide, antimony oxide and salt cake in the recited amounts in a batch in making the low-iron glass so that a seed free time in making the glass is no more than 100 minutes.

IN THE DRAWINGS

FIG. 3 is a chart setting forth example glass compositions according to example embodiments of this invention.

DETAILED DESCRIPTION OF CERTAIN EXAMPLE EMBODIMENTS OF THIS INVENTION

Figures 1, 2:
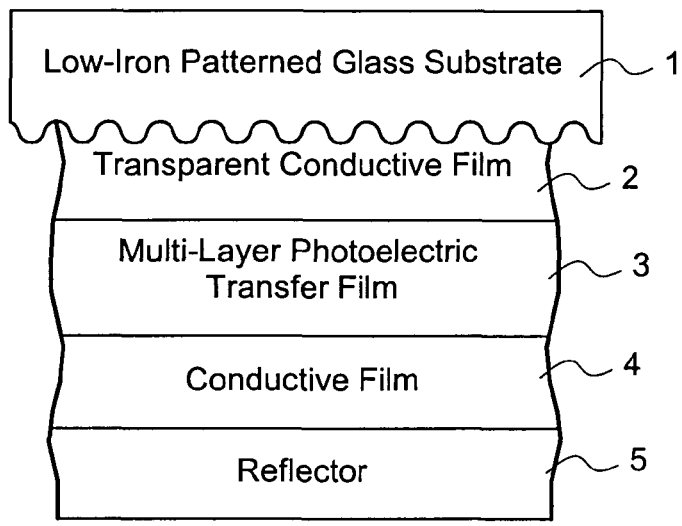
FIG. 1 is a cross sectional view of a solar cell according to an example embodiment of this invention.
FIG. 2 is a chart setting forth glass batches according to certain examples of this invention.

An example photovoltaic device (e.g., solar cell) is illustrated in cross section in FIG. 1. The solar cell includes, for example and without limitation, high transmission low-iron glass substrate 1, conductive film 2 which may be transparent, a photoelectric transfer film 3 which may include one or more layers, a rear surface electrode 4, and an optional reflector 5. In certain example embodiments, the photoelectric transfer film 3 may include a p-type silicon inclusive layer, an i-type silicon inclusive layer, and an n-type silicon inclusive layer. These silicon inclusive layers may be composed of amorphous silicon or any other suitable type of semiconductor with suitable dopants in certain example embodiments of this invention. The electrodes 2, 4 may be of a transparent conductor such as zinc oxide, or any other suitable material in certain example embodiments of this invention, and the reflector 5 may be of aluminum, silver or the like.

In certain example embodiments of this invention, one or both major surfaces (e.g., the interior surface only) of the glass substrate 1 may be patterned. Light tends to be refracted at interface(s) resulting from the patterning of the glass substrate 1, thereby causing light to proceed through the semiconductor layer(s) at an angle(s) such that the path is longer. As a result, more light can be absorbed by the solar cell and output current and/or efficiency can be improved/increased. In certain example embodiments of this invention, the patterned surface(s) of the glass substrate 1 may have a surface roughness (between peaks/valleys) of from about 0.1 to 1.5 µm, more preferably from about 0.5 to 1.5 µm. In certain example embodiments of this invention, the glass substrate 1 has one or more surfaces which are patterned so as to have a waviness feature defined therein. In the FIG. 1 embodiment, only one surface of the glass substrate 1 is patterned, although in other example embodiments both surfaces of the glass substrate may be patterned.

The optional patterning is preferably defined in the glass substrate 1 during the process of making the glass. An example technique for making such patterned glass is as follows. A furnace or melter is provided, as are first and second opposing rollers which define a nip therebetween. At least one of the rollers has a pattern defined in a surface thereof, where the pattern is made up of a plurality of peaks and valleys. A ribbon of glass exiting the furnace or melter is fed into the nip between the patterning rollers and reaches the nip at a temperature of from about 1,900 to 2,400 degrees F. At the nip, the pattern(s) from the roller(s) is transferred to the ribbon of glass, and then the patterned glass ribbon exits the nip at a temperature of from about 1,100 to 1,600 degrees F. After leaving the nip, the patterned glass ribbon is annealed, and may then be cut into a plurality of sheets. These glass sheets may or may not be heat treated (e.g., thermally tempered), and may be used in solar cell applications such as shown in FIG. 1. Example techniques for making the patterned glass substrate 1 are illustrated and described in U.S. Pats. No. 6,796,146 and/or 6,372,327 (except that different types of patterns are used), the disclosures of which are hereby incorporated herein by reference.

Certain glasses for patterned substrate 1 according to example embodiments of this invention utilize soda-lime-silica flat glass as their base composition/glass. In addition to base composition/glass, a colorant portion may be provided in order to achieve a glass that is fairly clear in color and/or has a high visible transmission. An exemplary soda-lime-silica base glass according to certain embodiments of this invention, on a weight percentage basis, includes the following basic ingredients:

TABLE 1

EXAMPLE BASE GLASS (or in batch)

| Ingredient | Wt. % |
|---|---|
| $SiO_2$ | 67-75% |
| $Na_2O$ | 10-20% |
| CaO | 5-15% |
| MgO | 0-7% |
| $Al_2O_3$ | 0-5% |
| $K_2O$ | 0-5% |

Other ingredients, including various conventional refining aids, such as $SO_3$, carbon, and the like may also be included in the base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4 \times 7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO.

In addition to the base glass (e.g., see Table 1 above), in making glass according to certain example embodiments of the instant invention the glass batch includes materials (including colorants and/or oxidizers) which cause the resulting glass to be fairly neutral in color (slightly yellow in certain example embodiments, indicated by a positive b* value) and/or have a high visible light transmission. These materials may either be present in the raw materials (e.g., small amounts of iron), or may be added to the base glass materials in the batch (e.g., antimony and/or the like). In certain example embodiments of this invention, the resulting glass has visible transmission of at least 75%, more preferably at least 80%, even more preferably of at least 85%, and most preferably of at least about 90% (sometimes at least 91%) (Lt D65). In certain example non-limiting instances, such high transmissions may be achieved at a reference glass thickness of about 3 to 4 mm In certain embodiments of this invention, in addition to the base glass, the glass and/or glass batch comprises or consists essentially of materials as set forth in Table 2 below (in terms of weight percentage of the total glass composition):

TABLE 2

EXAMPLE ADDITIONAL MATERIALS IN GLASS OR GLASS BATCH

| Ingredient | General (Wt. %) | More Preferred | Most Preferred |
|---|---|---|---|
| total iron (expressed as $Fe_2O_3$): | 0.001-0.05% | 0.005-0.045% | 0.01-0.03% |
| % FeO: | 0-0.0040% | 0-0.0030% | 0.0001-0.0010% |
| glass redox | <=0.10 | <=0.06 | <=0.04 |

TABLE 2-continued

EXAMPLE ADDITIONAL MATERIALS
IN GLASS OR GLASS BATCH

| Ingredient | General (Wt. %) | More Preferred | Most Preferred |
|---|---|---|---|
| (FeO/total iron): cerium oxide: | 0-0.07% | 0-0.04% | 0-0.02% |
| antimony oxide: | 0.01-1.0% | 0.01-0.5% | 0.1-0.3% |
| $SO_3$: | 0.24-0.45% | 0.30-0.40% | 0.32-0.38% |
| Lithium oxide: | 0.25-4.5% | 0.25-3.5% | 0.5-3% |
| $TiO_2$ | 0-1.0% | 0.005-0.4% | 0.01-0.04% |

In certain example embodiments, the antimony may be added to the glass batch in the form of one or more of $Sb_2O_3$ and/or $NaSbO_3$. Note also $Sb(Sb_2O_5)$. The use of the term antimony oxide herein means antimony in any possible oxidation state, and is not intended to be limiting to any particular stoichiometry. Likewise, the use of the term lithium oxide is not intended to be limiting to any particular stoichiometry.

In certain preferred embodiments, there is no cerium oxide in the glass. In particular, the presence of cerium oxide can have a detrimental effect on the transmission of the glass after exposure to UV and/or sunlight. This has been seen at 0.01 and 0.02% by weight. Thus, in certain example embodiments, the glass contains no cerium oxide. In certain embodiments, the resulting glass may contain from 0 to 0.01% by weight of cerium oxide.

The low glass redox evidences the highly oxidized nature of the glass. Due to the antimony (Sb), the glass is oxidized to a very low ferrous content (% FeO) by combinational oxidation with antimony in the form of antimony trioxide ($Sb_2O_3$), sodium antimonite ($NaSbO_3$), sodium pyroantimonate (Sb ($Sb_2O_5$)), sodium or potassium nitrate and/or sodium sulfate. In certain example embodiments, the composition of the glass substrate 1 includes at least twice as much antimony oxide as total iron oxide, by weight, more preferably at least about three times as much, and most preferably at least about four times as much antimony oxide as total iron oxide.

In certain example embodiments of this invention, the colorant portion is substantially free of other colorants (other than potentially trace amounts). However, it should be appreciated that amounts of other materials (e.g., refining aids, melting aids, colorants and/or impurities) may be present in the glass in certain other embodiments of this invention without taking away from the purpose(s) and/or goal(s) of the instant invention. For instance, in certain example embodiments of this invention, the glass composition is substantially free of, or free of, one, two, three, four or all of: erbium oxide, nickel oxide, cobalt oxide, neodymium oxide, chromium oxide, and selenium. The phrase "substantially free" means no more than 2 ppm and possibly as low as 0 ppm of the element or material.

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{+2}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass which can sometimes be undesirable when seeking to achieve a neutral or clear color.

The use of antimony (e.g., in the form of antimony oxide) as an oxidizer in the glass batch acts as a decolorizer since during melting of the glass batch it causes iron in the ferrous state ($Fe^{2+}$; FeO) to oxidize to the ferric state ($Fe^{3+}$). This role of antimony as an oxidizer decreases the amount of ferrous state iron left in the resulting glass. The presence of antimony oxide in the glass batch causes an amount of the strong blue-green colorant of ferrous iron ($Fe^{2+}$; FeO) to oxidize into the weaker yellow-green ferric iron colorant ($Fe^{3+}$) during the glass melt (note: some ferrous state iron will usually remain in the resulting glass). The aforesaid oxidation of the iron tends to reduce coloration of the glass and also causes visible transmission to increase. Any yellowish color caused by oxidation of iron into ferric state (Fe3+) iron (i.e., positive b*) is acceptable in solar cell applications and need not be compensated for by addition of other colorants thereby saving cost in certain example embodiments of this invention.

It will be appreciated by those skilled in the art that the addition of antimony oxide results in a glass with a lower "glass redox" value (i.e., less iron in the ferrous state FeO). In this regard, the proportion of the total iron in the ferrous state (FeO) is used to determine the redox state of the glass, and redox is expressed as the ratio FeO/Fe2O3, which is the weight percentage (%) of iron in the ferrous state (FeO) divided by the weight percentage (%) of total iron (expressed as Fe2O3) in the resulting glass. Due to at least the presence of the antimony oxide, the redox of glass according to certain example embodiments of this invention is very low as mentioned above, and the amount of iron in the ferrous state (FeO) will also be low as discussed above.

Refining is the process by which bubbles are removed from the glass melt. This is achieved partly by rise to the surface which can be aided by bubble growth or by bubble dissolution (the latter applying to small bubbles).

Figure 4:
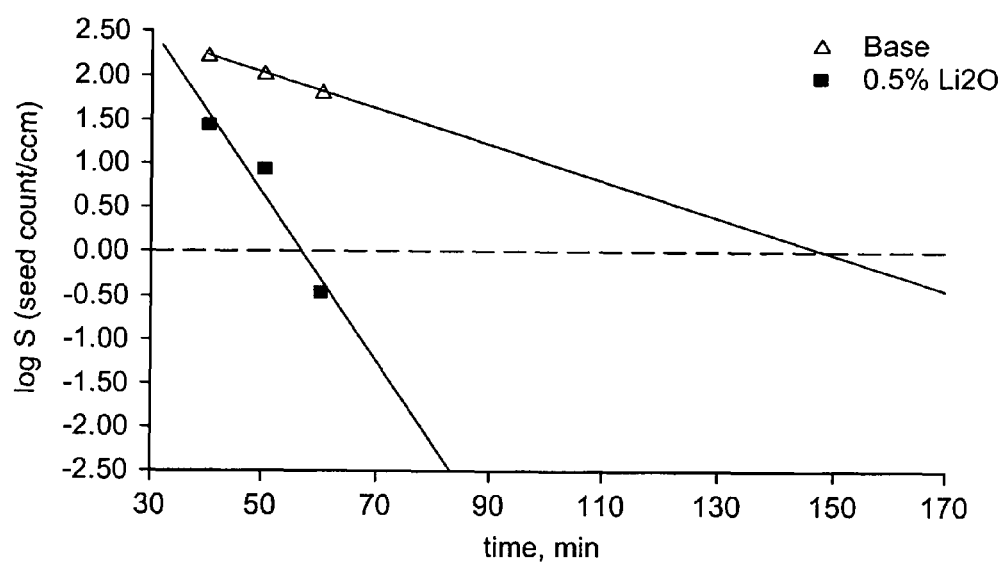
FIG. 4 is a seed count versus refining time graph illustrating that the introduction of lithium oxide reduces the refining time needed to achieve seed-free status in high transmission low iron glass according to example embodiments of this invention.

It has been found that the use of lithium oxide (e.g., added in the form of lithium carbonate) in the glass batch in connection with high transmission low iron glass has the effect of improve refining conditions by lower the melting temperature of the glass (log η=2). In particular, it has been found that providing appropriate amounts of lithium oxide in low-iron high transmission glass lowers the log η=2 temperature so as to improve the refining of these oxidized glasses. The addition of the lithium oxide tends to promote rise to the surface type refining of the glass. Thus, the refining time required to achieve a seed free glass (or substantially seed free glass) can be reduced, which is high advantageous with respect to the glass manufacturing process. FIG. 4 illustrating these surprising benefits, compared to the comparative example (CA) (or base) which has no lithium oxide in the batch. It has also been found that the use of certain amounts of salt cake ($SO_3$) in the batch and resulting glass help to achieve the desired oxidation, as desired oxidation may be achieved by operations and chemically with sulfates (e.g., salt cake) and/or nitrates. Thus, in certain example embodiments of this invention, the low iron glass is particularly efficiently made with respect to both performance and manufacturability using a combination of certain amounts of salt cake, antimony oxide (e.g., antimony trioxide), optionally sodium nitrate, and lithium oxide. In certain example embodiments, the batch has a batch redox (as opposed to glass redox) of from +12 to +50, more preferably from +30 to +40. It is noted that glass according to certain example embodiments of this invention is often made via the known float process in which a tin bath is utilized. It will thus be appreciated by those skilled in the art that as a result of forming the glass on molten tin in certain exemplary embodiments, small amounts of tin or tin oxide may migrate into surface areas of the glass on the side that was in contact with the tin bath during manufacture (i.e., typically, float glass may have a tin oxide concentration of 0.05% or more (wt.) in the first few microns below the surface that was in contact with the tin bath). In view of the above, glasses according to certain example embodiments of this invention achieve a neutral or substantially clear color and/or high visible transmission. In certain embodiments, resulting glasses according to certain example embodiments of this invention may be characterized by one or more of the following transmissive optical or color characteristics when measured at a thickness of from about 1 mm-6 mm (most preferably a thickness of about 3-4 mm; this is a non-limiting thickness used for purposes of reference only) (Lta is visible transmission %). It is noted that in the table below the a* and b* color values are determined per Ill. D65, 10 degree Obs.

TABLE 3

GLASS CHARACTERISTICS OF EXAMPLE EMBODIMENTS

| Characteristic | General | More Preferred | Most Preferred |
|---|---|---|---|
| Lta (Lt D65): | >=85% | >=90% | >=91% |
| % τe (ISO 9050): | >=85% | >=90% | >=91% |
| % FeO (wt. %): | <=0.004% | <=0.003% | <=0.0010% |
| L* (Ill. D65, 10 deg.): | 90-99 | n/a | n/a |
| a* (Ill. D65, 10 deg.): | −1.0 to +1.0 | −0.5 to +0.5 | −0.2 to 0.0 |
| b* (Ill. D65, 10 deg.): | 0 to +1.5 | +0.1 to +1.0 | +0.2 to +0.7 |

The aforesaid characteristics of the glass substrate 1 are for the glass substrate alone, not the overall solar cell or solar cell module.

As can be seen from Table 3 above, glasses for substrate 1 of certain embodiments of this invention achieve desired features of fairly clear color and/or high visible transmission, with slightly positive b* color in certain embodiments, while not requiring iron to be eliminated from the glass composition. This may be achieved through the provision of the unique material combinations described herein.

Example glasses for substrates 1 were made and tested according to example embodiments of this invention. Glasses of this invention may be made from batch ingredients using well known glass melting and refining techniques. The compositions of the batches used in making the glasses of Example 1 (Ex. 1), Example 2 (Ex. 2) and the Comparative Example (CA) are set forth in FIG. 2, in terms of kg added to the batch. The batches for each of Ex. 1 and Ex. 2 included lithium oxide, added to the batch by way of lithium carbonate. Meanwhile, the resulting glass compositions after refining and processing are set forth in FIG. 3. While not shown in FIG. 3, the glass composition included about 0.5% lithium oxide. The solar characteristics for the resulting example glasses are also shown in FIG. 3. It is noted that Lta (visible transmission %) was measured in accordance with Ill. D65, % τe (total energy or total solar) was measured in accordance with ISO 9050 (incorporated herein by reference), and transmissive L*, a* and b* color coordinates (CIE) were measured using Ill. D65, 10 degree observer.

FIG. 3 shows that the seed free time (in minutes, the time to achieve a substantially seed free glass), is greatly reduced for Examples 1-2 compared to the CA. It is believed that the use of the lithium oxide in combination with the antimony and salt cake in this low-iron high transmission glass improved the refining of the glass in this respect, reducing the time needed to eliminate or substantially eliminate the seeds in the batch. As shown in FIG. 4, the use of the lithium oxide (compared to not using lithium oxide) greatly reduced the time needed to eliminate the seeds from the glass melt during the manufacturing process, the glass having about 0.5% lithium oxide.

In certain example embodiments, the batch ingredients used provides for a seed free time of no more than 100 minutes, more preferably no more than about 90 minutes, and most preferably no more than about 80 minutes.

Once given the above disclosure many other features, modifications and improvements will become apparent to the skilled artisan. Such features, modifications and improvements are therefore considered to be a part of this invention, the scope of which is to be determined by the following claims:

What is claimed is:

1. A method of making a low-iron highly transmissive glass for use in a photovoltaic device, the glass comprising:

| Ingredient | wt. % |
|---|---|
| SiO$_2$ | 67-75% |
| Na$_2$O | 10-20% |
| CaO | 5-15% |
| total iron (expressed as Fe$_2$O$_3$) | 0.001 to 0.05% |
| cerium oxide | 0 to 0.07% |
| antimony oxide | 0.01 to 1.0% |
| lithium oxide | 0.25 to 3.5% |
| salt cake | 0.30 to 0.40% | wherein the glass has visible transmission of at least 90%, a transmissive a* color value of −1.0 to +1.0 and a transmissive b* color value of from 0 to +1.5; and wherein the method comprises providing the lithium oxide, antimony oxide and salt cake in the recited amounts in a batch in making the low-iron glass so that a seed free time in making the glass is no more than 100 minutes, and wherein the batch has a batch redox of from +30 to +40.

* * * * *